(12) United States Patent
Dai et al.

(10) Patent No.: US 8,823,936 B2
(45) Date of Patent: Sep. 2, 2014

(54) STRUCTURE FOR CRITICAL DIMENSION AND OVERLAY MEASUREMENT

(71) Applicants: Yunqing Dai, Shanghai (CN); Jian Wang, Shanghai (CN); Zhibiao Mao, Shanghai (CN)

(72) Inventors: Yunqing Dai, Shanghai (CN); Jian Wang, Shanghai (CN); Zhibiao Mao, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/667,363

(22) Filed: Nov. 2, 2012

(65) Prior Publication Data

US 2013/0120739 A1 May 16, 2013

(30) Foreign Application Priority Data

Nov. 11, 2011 (CN) .......................... 2011 1 0356290

(51) Int. Cl.
*G01B 11/00* (2006.01)
*G01B 11/14* (2006.01)
*G01B 11/28* (2006.01)
*G03F 7/20* (2006.01)

(52) U.S. Cl.
CPC ........ *G03F 7/70625* (2013.01); *G03F 7/70633* (2013.01)
USPC ........... 356/399; 356/401; 356/625; 356/636; 257/797

(58) Field of Classification Search
None
See application file for complete search history.

(56) References Cited

U.S. PATENT DOCUMENTS

| | | | | |
|---|---|---|---|---|
| 5,701,013 A * | 12/1997 | Hsia et al. | .................. | 250/491.1 |
| 5,712,707 A * | 1/1998 | Ausschnitt et al. | ........... | 356/401 |
| 5,731,877 A * | 3/1998 | Ausschnitt | .................... | 356/620 |
| 5,757,507 A * | 5/1998 | Ausschnitt et al. | ........... | 356/401 |
| 6,396,569 B2 * | 5/2002 | Zheng et al. | ..................... | 355/77 |
| 6,440,759 B1 * | 8/2002 | Commons et al. | ................. | 438/7 |
| 6,967,719 B2 * | 11/2005 | Sato et al. | ..................... | 356/401 |
| 7,181,089 B2 * | 2/2007 | Esaki et al. | ................... | 382/287 |
| 7,190,823 B2 * | 3/2007 | Chen | ............................ | 382/151 |
| 7,425,396 B2 * | 9/2008 | Gruss et al. | ..................... | 430/22 |
| 7,427,774 B1 * | 9/2008 | Mantz et al. | .................... | 257/48 |
| 7,463,367 B2 * | 12/2008 | Bowes | .......................... | 356/604 |
| 7,666,559 B2 * | 2/2010 | Schulz | ............................ | 430/22 |
| 8,143,731 B2 * | 3/2012 | Chiu | ............................. | 257/797 |
| 8,193,648 B2 * | 6/2012 | Lan et al. | ...................... | 257/797 |
| 8,329,360 B2 * | 12/2012 | Huang et al. | ...................... | 430/5 |
| 2005/0069790 A1 * | 3/2005 | Gruss et al. | ..................... | 430/22 |
| 2009/0231558 A1 * | 9/2009 | Dishon et al. | ................... | 355/27 |

FOREIGN PATENT DOCUMENTS

| KR | 2001028937 A | * | 4/2001 |
|---|---|---|---|
| KR | 2004061547 A | * | 7/2004 |
| KR | 2006105289 A | * | 10/2006 |

\* cited by examiner

*Primary Examiner* — Gordon J Stock, Jr.
(74) *Attorney, Agent, or Firm* — Anova law Group, PLLC

(57) ABSTRACT

The invention provides a structure for critical dimension and overlay measurement including a measuring unit, a first measurement pattern for measuring overlay and a second measurement pattern for measuring linewidth, line density and/or line semi-density. The first target pattern includes an outer bar structure disposed on a first layer and an inner bar structure disposed on a second layer; the outer bar structure and/or the inner bar structure has a same shared pattern structure with the second target pattern. The pattern structure includes four bars with the same shape positioned orthogonally and closely to each other, and at least two orthogonally positioned bars include N equally spaced rectangular lines of the same width, wherein, N is an odd number; the N rectangular lines include one central rectangular line and N−1 auxiliary rectangular lines.

7 Claims, 4 Drawing Sheets

--Prior Art—

--Prior Art--

US 8,823,936 B2

STRUCTURE FOR CRITICAL DIMENSION AND OVERLAY MEASUREMENT

CROSS-REFERENCE TO RELATED APPLICATION

This application claims the priority benefit of China application serial no. 201110356290.X, filed Nov. 11, 2011. All disclosure of the China application is incorporated herein by reference.

FIELD OF THE INVENTION

The present invention relates to the field of semiconductor manufacturing technology, and more particularly to a structure for critical dimension and overlay measurement.

BACKGROUND OF THE INVENTION

With the continuing improvement of the integration of the semiconductor chip, the critical dimension of the transistor has been reduced to nanoscale. The three-dimensional structures of the semiconductor components are decomposed into dozens of two-dimensional layers with photolithographic patterns in production. To achieve good performance of the components, the critical dimension of different photolithographic patterns as well as the alignment and overlay between different layers are required to be accurate.

Overlay measurement is usually performed by disposing two overlay targets in the photolithographic patterns respectively and measuring the relative displacement of the two overlay targets, so as to ensure the alignment between the two photolithographic patterns in two layers. The most commonly used overlay targets include the "Box-in-Box" target and the "Bar-in-Bar" target, as shown in FIG. 1 and FIG. 2, respectively.

On the other hand, the accuracy, uniformity and stability of the critical dimension are extremely significant to product yield in mass production. Therefore critical dimension measurement is an important means to ensure the product yield. With the increasing requirement for manufacturing precision, the critical dimension target may include isolated patterned regions and densely patterned regions according to the product design. FIG. 3 is a conventional critical dimension target. However, the critical dimension target and the overlay target are usually disposed in different areas in the photolithographic pattern of the same layer.

SUMMARY OF THE INVENTION

Accordingly, at least one objective of the present invention is to provide a structure for critical dimension and overlay measurement to reduce the area of the measuring patterns in chip manufacturing process.

To achieve these and other advantages and in accordance with the objective of the invention, as embodied and broadly described herein, the invention provides a structure for critical dimension and overlay measurement including a measuring unit, a first target pattern for measuring overlay and a second target pattern for measuring linewidth, line density and/or line semi-density, wherein, the first target pattern and the second target pattern are disposed on the scribe line around the wafer, the first target pattern includes an outer bar structure disposed on a first layer and an inner bar structure disposed on a second layer, the size of the outer bar structure is bigger than that of the inner bar structure; the second target pattern is disposed in the first layer and/or the second layer; wherein, the outer bar structure and/or the inner bar structure has a same shared pattern structure with the second target pattern; the pattern structure includes four bar patterns with the same shape positioned orthogonally and closely to each other, and at least two orthogonally positioned bar patterns include N equally spaced rectangular lines of the same width, wherein, N is an odd number; the N rectangular lines include one central rectangular line and N−1 auxiliary rectangular lines.

Preferably, the four bar patterns enclose to form a square.

Preferably, the central point of the bar pattern is in the middle of the side of the square.

Preferably, the length of the auxiliary rectangular lines is shorter than that of the central rectangular line.

Preferably, the width of the rectangular lines is the minimum linewidth.

Preferably, the number of the auxiliary rectangular lines is four.

Preferably, the length of the two auxiliary rectangular lines adjacent to the central rectangular line is shorter than that of the other two auxiliary rectangular lines.

Preferably, the second target pattern includes one or more alignment marks for positioning the rectangular lines.

Preferably, the alignment mark is disposed on the corner of the two orthogonally positioned bar patterns.

Preferably, the alignment mark is cross-shaped or L shaped or T shaped.

Preferably, the measuring unit includes an optical microscope for measuring the first target pattern and a scanning electron microscope for measuring the second target pattern.

Compared with the conventional measuring patterns, the structure of the present invention includes the overlay target pattern as well as the critical dimension target pattern, thus the area of the measuring patterns can be effectively reduced in wafer production. Furthermore, the critical dimension can be measured in different directions. In addition, the critical dimension target pattern includes all the isolated patterned region, the densely patterned region and the semi-densely patterned region, which can further reduce the area of the measuring patterns.

BRIEF DESCRIPTION OF THE DRAWINGS

The structure for critical dimension and overlay measurement of the present invention will be elucidated by reference to the following embodiments and the accompanying drawings, in which.

DETAILED DESCRIPTION OF THE EMBODIMENTS

The structure for critical dimension and overlay measurement of the present invention will be described in further details hereinafter with respect to the embodiments and the accompanying drawings.

Figure 1:
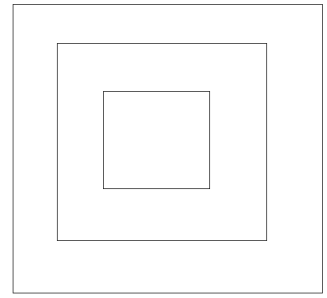
FIG. 1 is a top view of a conventional "Box-in-Box" overlay target.
Figure 2:
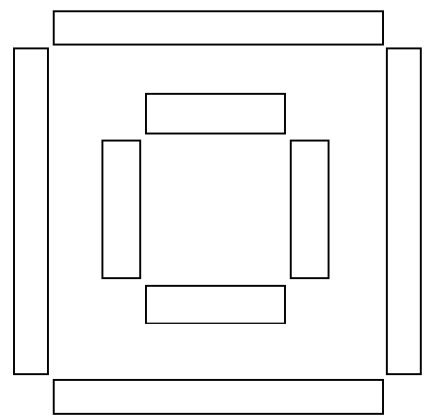
FIG. 2 is a top view of a conventional "Bar-in-Bar" overlay target.
Figure 3:
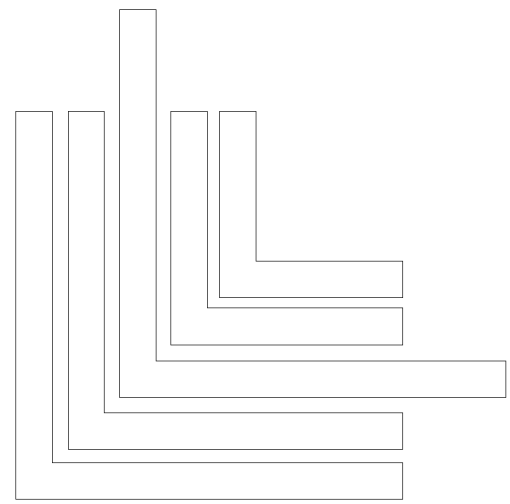
FIG. 3 is a top view of a conventional critical dimension target.
Figure 4:
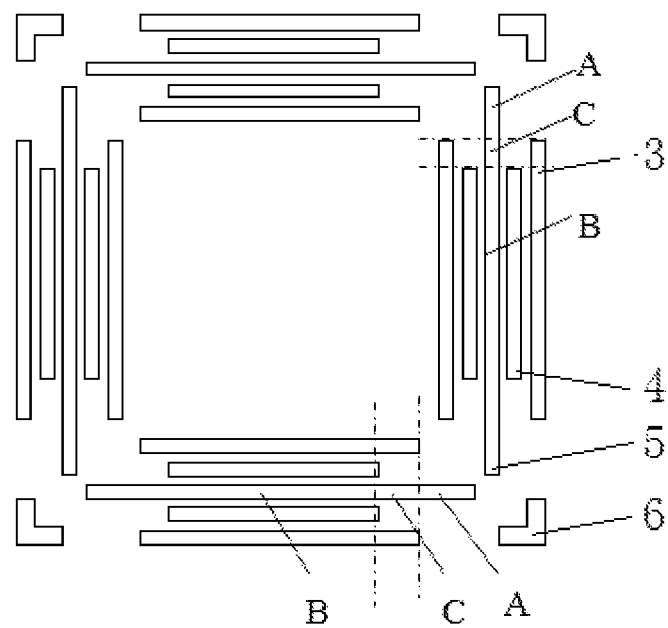
FIG. 4 is a top view illustrating the second target pattern in one embodiment of the present invention.
Figure 5:
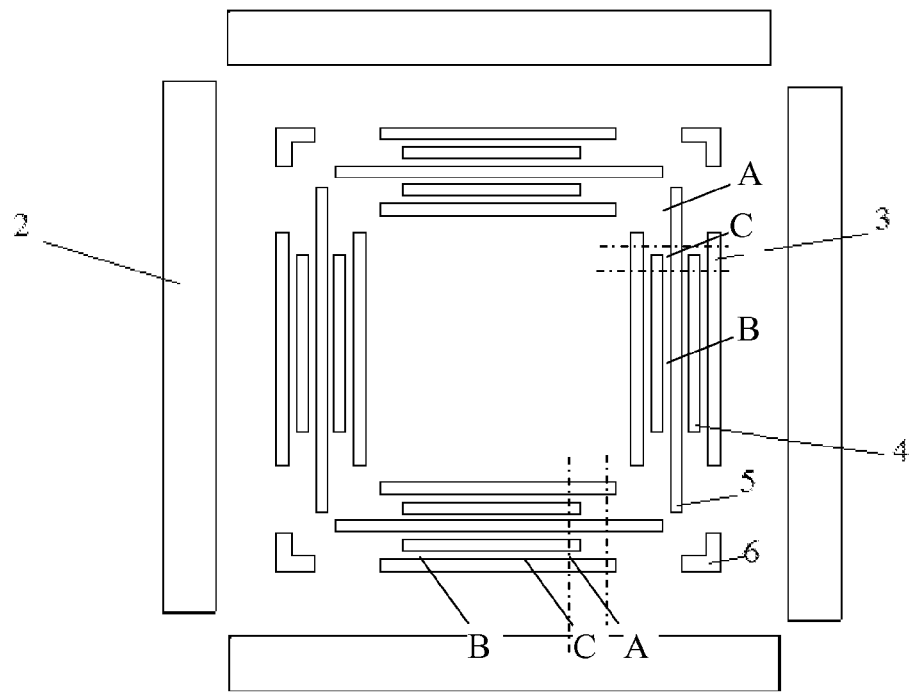
FIG. 5 is a top view illustrating the second target pattern having the same pattern structure with the inner bar structure in one embodiment of the present invention.
Figure 6:
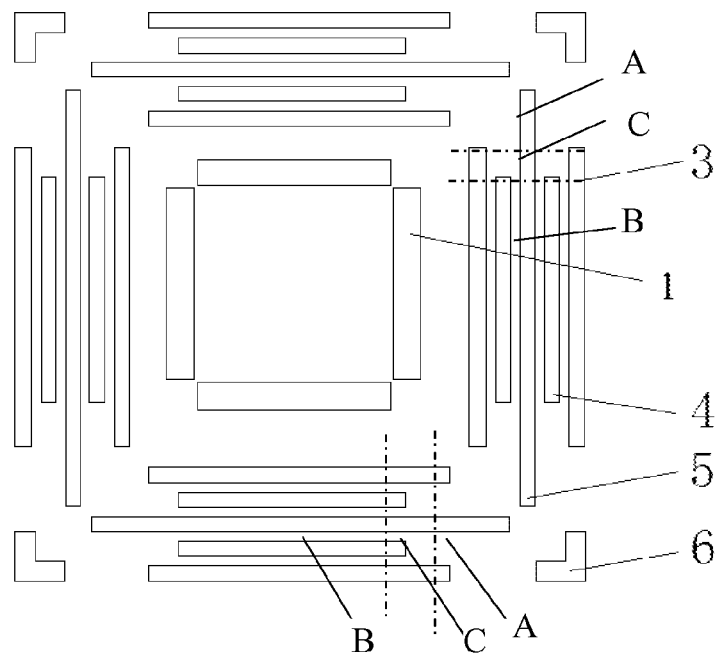
FIG. 6 is a top illustrating the second target pattern having the same pattern structure with the outer bar structure in one embodiment of the present invention.
Figure 7:
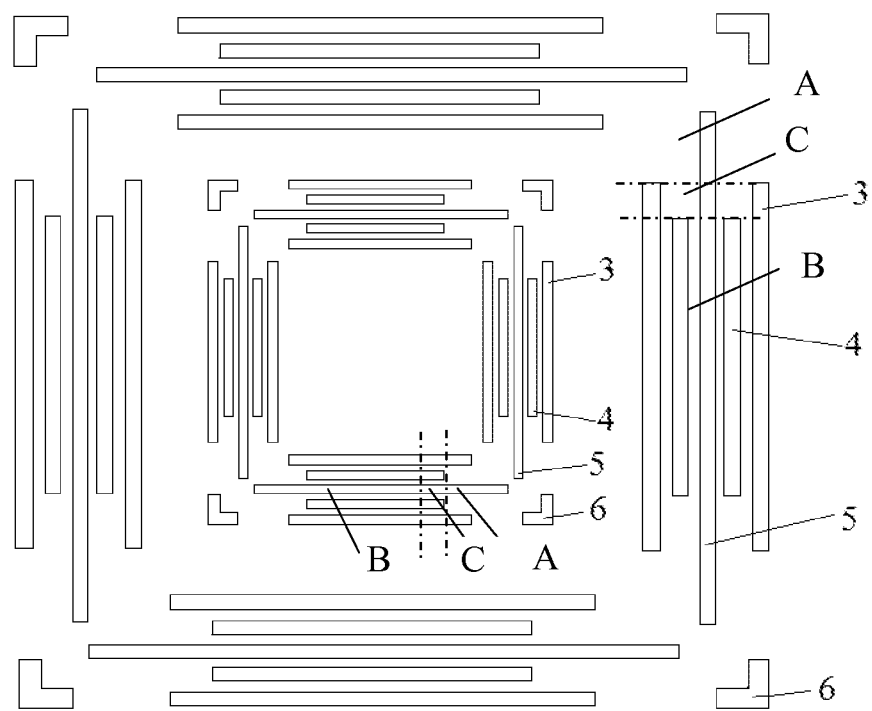
FIG. 7 is a top view illustrating the second target pattern having the same pattern structure with the inner bar structure and the outer bar structure in one embodiment of the present invention.

The structure for critical dimension and overlay measurement includes a measuring unit, a first target pattern and a second target pattern. The first target pattern and the second target pattern are disposed on the scribe line around the wafer; the measuring unit is used for measuring the target patterns. Wherein, the first target pattern is capable of being measured to determine overlay, it includes an outer bar structure disposed on a first layer ( the outer bar structure 2 as shown in FIG. 5) and an inner bar structure disposed on a second layer ( the inner bar structure 1 as shown in FIG. 6), the size of the outer bar structure is bigger than that of the inner bar structure. The overlay between the two layers can be obtained by measuring the relative displacement of the outer and inner bar structures by the measuring unit; the measuring unit can be an optical microscope. The second target pattern is capable of being measured to determine critical dimension such as linewidth, line density and line semi-density. The second target pattern can be disposed on the first layer, or the second layer, or both. Note that, the outer and/or the inner bar structure and the second target pattern have the same shared pattern structure, namely, the second target pattern disposed in the first layer has the same pattern structure with the outer bar structure, as shown in FIG. 6 and FIG. 7; similarly, the second target pattern disposed in the second layer has the same pattern structure with the inner bar structure, as shown in FIG. 5 and FIG. 7. The pattern structure includes four bar pattern with the same shape positioned orthogonally and closely to each other, and at least two orthogonally positioned bar patterns each includes N equally spaced rectangular lines of the same width, wherein, N is an odd number; the N rectangular lines include one central rectangular line and N−1 auxiliary rectangular lines. Now referring to FIG. 4 and FIG. 6, the second target pattern is disposed in the first layer and has the same pattern structure with the outer bar structure; The inner bar structure 1 is disposed in the second layer. The four bar patterns of the pattern structure all include rectangular lines, and the number of the auxiliary rectangular lines in each bar pattern is four. Preferably, the width of the rectangular lines is the minimum linewidth. The critical dimension can be obtained by measuring these rectangular lines by the measuring unit; the measuring unit can be a scanning electron microscope. The four bar pattern enclose to form a square, and the central point of the bar pattern is in the middle of the side of the square. As shown in FIG. 4, the lengths of the auxiliary rectangular lines 3, 4 are shorter than the central rectangular line 5, furthermore, the length of the two auxiliary rectangular lines 4 adjacent to the central rectangular line 5 is shorter than that of the two outer auxiliary rectangular lines 3. As a result, the portion A of the central rectangular line longer than the auxiliary rectangular lines 3, 4 forms an isolated patterned region for linewidth measurement; the common portion B of the rectangular lines 3, 4, 5, namely dense lines, forms a densely patterned region for line density measurement; and the common portion C of the central rectangular line 5 and the auxiliary rectangular lines 3 longer than the auxiliary rectangular lines 4, namely semi-dense lines, forms a semi-densely patterned region for line semi-density measurement. Therefore, the linewidth, the line density and the line semi-density of the critical dimension can be obtained through these rectangular lines with different lengths. In addition, since both the horizontal bar patterns and the vertical bar patterns contain these rectangular lines, the critical dimension can be measured in different directions.

Furthermore, with the development of integrated circuit technology, requirements for automatic measurement performed by the critical dimension measuring device such as CD-SEM have greatly increased. In automatic measurement, addressing point and auto focusing point are needed. If the addressing point and the auto focusing point are disposed on the rectangular lines, the electron beam emitted from the CD-SEM may damage the photolithographic pattern, so as to affect the measuring accuracy. Moreover, since the rectangular lines are not in irregular shape, positioning error is likely to occur. In a preferred embodiment of the present invention, the second target pattern further includes one or more alignment marks 6 for addressing and auto focusing so as to increase the measuring success ratio and measuring accuracy. The alignment mark can be positioned on the corner of the two orthogonally positioned bar patterns, and can be cross-shaped, L shaped or T shaped. As shown in FIG. 4, the four L shaped alignment marks are position on the four corners of the square.

In summary, the structure of the present invention can be used to perform both overlay measurement and critical dimension measurement, so as to effectively reduce the area of the measuring patterns in wafer production. Furthermore, the critical dimension can be measured both in horizontal and vertical direction, and the linewidth, the line density and/or the line semi-density of the critical dimension are measured through a single second target pattern, which can further reduce the area of the critical dimension measuring patterns. The structure of the present invention can be used to measure critical dimension of 0.25 micron (μm) or less in photolithographic process.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A structure for critical dimension and overlay measurement including a first target pattern for measuring overlay and a second target pattern for measuring linewidth, line density and line semi-density, wherein, the first target pattern and the second target pattern are disposed on a scribe line around a wafer, the first target pattern includes an outer bar structure disposed on a first layer and an inner bar structure disposed on a second layer, the size of the outer bar structure is bigger than that of the inner bar structure; the second target pattern is disposed in the first layer and/or the second layer, wherein, the second target pattern disposed in the first layer and/or the second layer has a same pattern structure with the outer bar structure and/or the inner bar structure; wherein the pattern structure includes four bar patterns with the same shape positioned orthogonally to each adjacent bar pattern, and at least two orthogonally positioned bar patterns each includes five equally spaced rectangular lines of the same width; the five rectangular lines include one central rectangular line and four auxiliary rectangular lines, wherein the auxiliary rectangular lines are shorter than the central rectangular line, the length of the two auxiliary rectangular lines adjacent to the central rectangular line is shorter than that of the other two auxiliary rectangular lines.

2. The structure according to claim 1, wherein the second target pattern includes one or more alignment marks for positioning the rectangular lines.

3. The structure according to claim 1, wherein the four bar patterns enclose to form a square.

4. The structure according to claim 2, wherein the one or more alignment marks are printed on each corner of the two orthogonally positioned bar patterns.

5. The structure according to claim 2, wherein the one or more alignment marks are L shaped.

6. The structure according to claim 3, wherein a central point of each of the four bar patterns is in a middle of one side of the square.

7. The structure according to claim 6, wherein the width of the rectangular lines is minimum linewidth.

* * * * *